United States Patent [19]
Kurtz et al.

[11] Patent Number: 4,510,671
[45] Date of Patent: Apr. 16, 1985

[54] DIELECTRICALLY ISOLATED TRANSDUCER EMPLOYING SINGLE CRYSTAL STRAIN GAGES

[75] Inventors: Anthony D. Kurtz, Englewood; Timothy A. Nunn, Ridgewood; Joseph R. Mallon, Franklin Lakes, all of N.J.

[73] Assignee: Kulite Semiconductor Products, Inc., Ridgefield, N.J.

[21] Appl. No.: 537,100

[22] Filed: Nov. 21, 1983

Related U.S. Application Data

[62] Division of Ser. No. 298,275, Aug. 31, 1981, Pat. No. 4,456,901.

[51] Int. Cl.³ .................. H01L 29/84; G01L 1/22
[52] U.S. Cl. .................. 29/571; 29/610 SG; 29/576 B; 338/4; 338/5; 357/26; 357/91; 148/DIG. 159
[58] Field of Search .............. 338/2, 3, 4, 5; 73/726, 73/777, 227, 721, 708; 357/26, 91; 29/610 SG, 591, 580, 576 R, 571, 576 B; 148/1.5, 187, 188

[56] References Cited

U.S. PATENT DOCUMENTS

| | | | |
|---|---|---|---|
| 3,800,264 | 3/1974 | Kurtz et al. | 338/2 |
| 4,003,127 | 1/1977 | Jaffe et al. | 29/580 |
| 4,188,258 | 2/1980 | Mounteer et al. | 156/628 |
| 4,317,126 | 2/1982 | Gragg, Jr. | 357/26 |

OTHER PUBLICATIONS

Surface Silicon Crystallinity and Anomalous Composition Profiles of Buried $SiO_2$ & $Si_3N_4$ Layers Fabricated by Oxygen and Nitrogen Implantation in Silicon, Maeyama S.; Kajiyama K., Jpn. J. Appl. Phys., vol. 21, No. 5, May 1982, pp. 744-751.

C.M.O.S. Devices Fabricated on Buried $SiO_2$ Layers Formed by Oxygen Implantation into Silicon, Izumi, K.; Doken, M.; Ariyoshi, H., Electron Lett., Aug. 1978, vol. 14, No. 18.

Multiple SOI Structure Fabricated by High Dose Oxygen Implantation and Epitaxial Growth, Irita, Y.; Kuni, Y.; Takahashi, M.; Kajiyama, K., Jpn. J. Appl. Phys., vol. 20, No. 12, Dec. 1981, pp. L909-L912.

Primary Examiner—Brian E. Hearn
Assistant Examiner—David A. Hey
Attorney, Agent, or Firm—Arthur L. Plevy

[57] ABSTRACT

A transducer structure is disclosed which comprises a single crystal semiconductor diaphragm dielectrically isolated by a layer of silicon dioxide from a single crystal gage configuration. The methods depicted employ high dose oxygen which is ion implanted into a monocrystalline wafer to form a buried layer of silicon dioxide with the top surface of the wafer being monocrystalline silicon. An additional layer of silicon is epitaxially grown on the top surface of the wafer to enable the etching or formation of a desired gage pattern.

7 Claims, 7 Drawing Figures

DIELECTRICALLY ISOLATED TRANSDUCER EMPLOYING SINGLE CRYSTAL STRAIN GAGES

This is a divisional of application Ser. No. 298,275 filed on Aug. 31, 1981, now U.S. Pat. No. 4,456,901.

BACKGROUND OF THE INVENTION

This invention relates to pressure transducers and more particularly to methods for fabricating such transducers.

The prior art is replete with a number of transducer configurations which employ diaphragms and have located on the diaphragm piezoresistive elements. A plurality of such devices incorporate semiconductor diffusion techniques which operate to diffuse the transducers into the semiconductor substrate. Such devices are well known in the art. For example, reference is made to U.S. Pat. No. 3,654,579 entitled ELECTROMECHANICAL TRANSDUCERS AND HOUSINGS issued on Apr. 4, 1972 to A. D. Kurtz et al and assigned to the Assignee herein.

In any event, the prior art has been concerned with providing a pressure sensor where the strain gage is isolated from the diaphragm by means of a dielectric layer such as silicon dioxide. The techniques of the prior art disclosed the epitaxial growth of silicon on the silicon dioxide layer to provide a polycrystalline sensor or a polycrystalline substrate.

In U.S. Pat. No. 3,800,264 entitled HIGH TEMPERATURE TRANSDUCERS AND HOUSINGS INCLUDING FABRICATION METHODS which issued on Mar. 26, 1974 to A. D. Kurtz et al and is assigned to the Assignee herein, there is shown a dielectrically isolated transducer. In this configuration, the polycrystalline layer serves as a support for the single crystal regions which are to be the strain sensors. The layer is provided by epitaxial growth techniques and incorporates therein a polycrystalline diaphragm structure. Based on this technique, other patents such as U.S. Pat. No. 3,858,150 entitled POLYCRYSTALLINE SILICON PRESSURE SENSOR issued on Dec. 31, 1974 to Gurtlar et al and assigned to Motorola depicts a piezoresistive pressure sensor which is formed in a polycrystalline silicon layer. In this device, the polycrystalline silicon layer is deposited on an insulating etch stop layer of silicon nitride, which, in turn, is deposited over a substrate of monocrystalline silicon. The substrate is configured to support the silicon nitride layer by etching away the inner section.

U.S. Pat. No. 3,922,705 issued on Nov. 25, 1975 to Yerman and entitled A DIELECTRICALLY ISOLATED INTEGRAL SILICON DIAPHRAGM OR OTHER SEMICONDUCTOR PRODUCT shows a silicon diaphragm including a single crystal substrate bonded to a single crystal strain component with an intermediate insulating layer and a glass bonding layer. This patent requires the use of an intermediate glass layer for providing bonding and also employs epitaxial single crystal silicon regions. According to such techniques, U.S. Pat. No. 4,003,127 issued on Jan. 18, 1977 to Jaffe et al entitled POLYCRYSTALLINE SILICON PRESSURE TRANSDUCER depicts a transducer having a polycrystalline silicon diaphragm. The silicon diaphragm is vapor deposited on an etch resistant layer covering a surface of a wafer or base which is constructed from monocrystalline silicon.

In any event, it has long been an object of the transducer art to provide a single crystal silicon diaphragm having emplaced thereon single crystal silicon gages. Essentially, polycrystalline silicon is not as effective as single or monocrystalline silicon. The polycrystalline silicon does not possess the mechanical strength of the single crystalline silicon as well as the fact that polycrystalline silicon tends to creep as it behaves in a more plastic way than single crystal silicon. Due to the nature of polycrystalline silicon, hysteresis occurs over temperature ranges at the crystal boundaries. Dimensional control of polycrystalline silicon is extremely difficult and normally in order to provide thin diaphragms, one requires thick wafers which are then lapped and polished to obtain proper control. On the other hand, single crystal silicon is inherently stronger than polycrystalline silicon and it does not exhibit any substantial creep or hysteresis problems. It is also preferable to work with certain types of etching on single crystal silicon in order to produce an optimum transducer. For example, in employing an anisotropic etch, one can achieve well defined sloping walls with single crystal silicon and hence, the mechanical geometry of the device is easily controlled over similar devices made and manufactured with polycrystalline silicon.

It is therefore an object of the present invention to provide a transducer structure which employs a single crystalline diaphragm and a single crystalline sensor separated from the diaphragm by an oxide layer. In this manner, one will provide both a single crystalline gage and a single crystalline diaphragm and hence, eliminate the disadvantages of polycrystalline structures. In order to fabricate such a device, one utilizies a process for implanting oxygen ions beneath the surface of a single crystal wafer and thereafter growing additional single crystal silicon on the surface of the ion implanted wafer. By employing this technique, one can provide a unique transducer configuration which has all the advantages of single crystal silicon.

BRIEF DESCRIPTION OF THE PREFERRED EMBODIMENT

A semiconductor pressure transducer comprising a diaphragm layer of single crystal silicon, an intermediate layer of silicon dioxide implanted beneath the top surface of said diaphragm layer and at least one single crystal gage configuration integrally formed between the top surface and said intermediate layer.

DETAILED DESCRIPTION OF THE INVENTION

Figure 1:
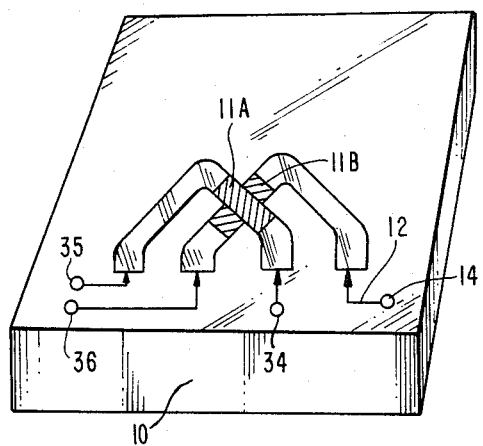
FIG. 1 is a plan view of a transducer according to this invention.

Referring to FIG. 1, there is shown a transducer configuration according to this invention. The FIG. depicts a substrate or diaphragm 10 which is rectangular in configuration. It is, of course, understood that circular diaphragms as well as any other geometrical configurations can be employed as well. The diaphragm 10 or base member is fabricated from a single crystal silicon and has positioned on the top surface a piezoresistive bridge arrangement 11. Th bridge arrangement is an interesting configuration and will be discussed subsequently.

In any event, the gage 11 comprises a relatively flat wafer of single crystalline piezoresistive material such as silicon. The gage 11 includes four contacts which are coupled to the arms and brought out via terminal leads such as 12 to contact areas as 14. The particular gage, as will be further discussed, is only by way of example and is relatively well known. See, for example, U.S. Pat. No. 3,123,788 entitled PIEZORESISTIVE GAGE issued on Mar. 3, 1964 to W. G. Pfann et al. This patent shows a strain gage configuration as 11 of FIG. 1.

Figure 2:
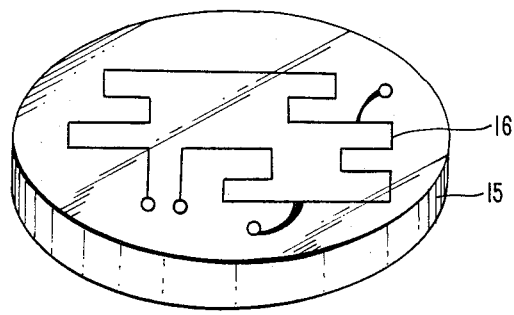
FIG. 2 is a plan view of an alternate embodiment of a transducer.

FIG. 2 depicts a circular wafer 15 having positioned thereon a single crystal bridge configuration which essentially consists of four piezoresistors and is a completely conventional structure. For examples of such bridge configurations as depicted in FIG. 2, reference is made to U.S. Pat. Nos. 3,800,264; 3,654,579 as well as many others.

Figure 3:
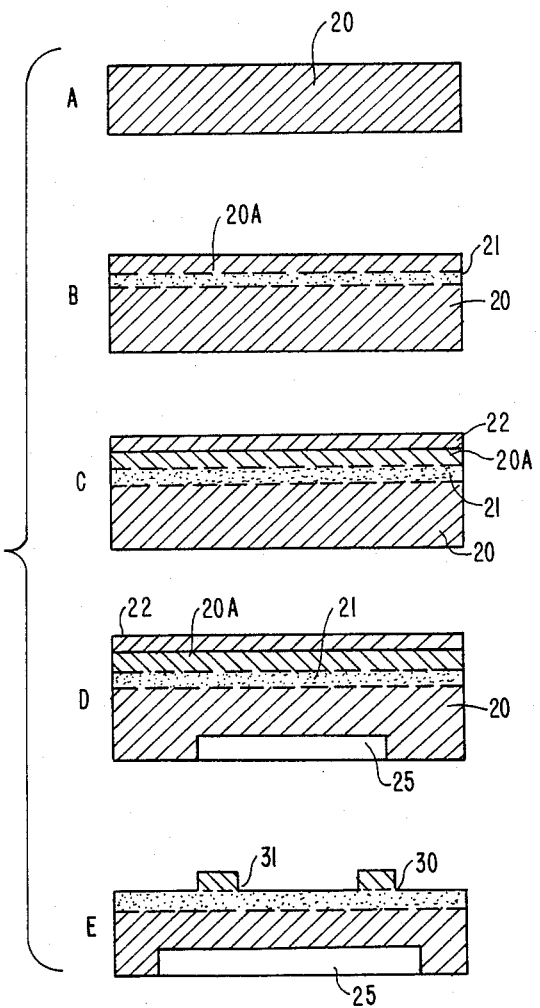
FIGS. 3A to 3E depict a series of process steps employed in producing transducers according to this invention.

Essentialy, in order to provide a transducer which incorporates a monocrystalline silicon diaphragm as 10 and 15 separated from a monocrystalline sensor configuration by a dielectric layer, the following process will be described in conjunction with FIG. 3.

It is interesting to note that such a structure is also provided in a copending application entitled SEMICONDUCTOR PRESSURE TRANSDUCER OR OTHER PRODUCT EMPLOYING LAYERS OF SINGLE CRYSTAL SILICON filed on Apr. 20, 1981, Ser. No. 06/255,461 and assigned to the Assignee herein. The technique in the copening application is completely different than the technique to be described herein. In the technique of the copending application, a monocrystalline silicon substrate has formed on the surface a grating pattern manifested by a series of parallel grooves. A layer of dielectric is thermally grown on the surface to replicate the pattern. A layer of silicon is deposited on the dielectric surface and is mainly single crystal as the orientation of the layer is determined by the grating.

Referring to FIG. 3A, there is shown a wafer 20 which is a single crystal silicon wafer. The wafer 20 may be of (100) oriented silicon wafer. The surface of the wafer 20 is conventionally polished to an optical finish and presents a relatively smooth surface.

Referring to FIG. 3B, oxygen ions at high concentration are then implanted at the surface of the layer. The oxygen concentration in the ion implantation technique is extremely high and occurs in doses which are greater than $1.8 \times 10^{18}/cm^2$. To achieve ion implantation, one employs approximately 150 kev with a dose rate at about $20\mu$ A/cm$^2$.

Ion implantation is a well known technique and impurities are introduced into the silicon crystal through the application of a high energy ion beam. Ion implantation is used in MOS ciruit fabrication and has achieved widespread industrial use in general. A typical ion implantation system includes an ion source, focusing electrodes, an acceleration tube, a mass arm analyzer, a neutral trap, a beam deflector, a raster generator and a wafer chamber. Many companies manufacture ion implantation devices and there are many examples of such machines in the prior art.

In any event, in utilization of high doses of oxygen at relatively large voltages, one provides a buried or implanted layer 21 of silicon dioxide, which layer is beneath the surface of the silicon wafer 20. The technique thus described produces the formation of a relatively thick buried layer 21 of silicon dioxide with an abrupt interface between the surface silicon layer. Techniques for providing such layers are known in the art and, for example, see a paper entitled "Formation of Abrupt Interfaces Between Surface Silicon and Buried SiO$_2$ Layers by very High Dose Oxygen-Ion Implantation" published in the Japanese Journal of Applied Physics, Vol. 19 (1980), No. 5 by T. Hayashi et al.

In employing the technique, one provides a single crystal silicon substrate 20 having implanted a thinner layer of silicon dioxide.

After ion implantation, the wafer 20 is annealed in a dry nitrogen environment at a temperature of about 1100° to 1200° C. for a period of approximately two hours. The oxygen concentration profile of the implanted layer 21 is nearly Gaussian with a maximum concentration of silicon dioxide at a depth of approximately 1.5 microns. As indicated, there does exist an intermediate region consisting of a mixture of silicon dioxide and nonoxidized silicon phases. However, there also exists a top layer 20A of single crystal silicon. The annealing process can take place in the dry nitrogen or another inert atmosphere such as argon.

It is understood that the top single crystal is relatively thin. Additional thickness is achieved by subsequent epitaxial growth.

Referring to FIG. 3C, the annealed wafer 20 is then subjected to an epitaxial growth technique where an additional layer 22 of silicon is grown on the surface of layer 20A using an epitaxial technique. A basic chemical reaction which can be used for the growth of epitaxial silicon is the hydrogen reduction of silicon tetrachloride. This reaction takes place at the surface. The growth rate of the epitaxial layer is dependent upon the flow rate of the silicon tetrachloride, the ratio of hydrogen and the temperature. Essentially, epitaxial growth techniques are well known.

According to this process, the silicon grown on surface 20A receives its crystallographic orientation from the monocrystalline silicon and is, essentially, an isoepitaxial growth. In this manner, the additional layer 22 is also single crystal silicon. The additional layer may be grown to a depth of between 2 to 5 microns or some other suitable thickness.

In order to form a transducer configuration, an aperture 25 is etched in the underside of the wafer 20. The aperture, which may be rectangular, circular and so on, forms an active area, which area will respond most readily to pressure or forces exerted on the structure and thus causes the thin portion of the structure to behave as a pressure or force responsive diaphragm. The aperture 25 can be etched to a desired depth or the silicon dioxide layer 21 can be employed as an etch stop. The preferred embodiment is directed toward fabricating the diaphragm from the underlying substrate in which case the aperture 25 is etched to a desired depth. Alternately the oxide layer can be used as an etch stop with the dielectrically isolated single crystal layer being used as a diaphragm in which case the piezoresistive elements may be formed by diffusion or other known techniques on the surface of this layer.

If one employs an anisotropic technique, one can achieve extremely steep sidewalls in fabrication of the active area aperture. Anisotropic etching of silicon is well known. For example, see a paper entitled "Fabrication of Normal Three-Dimensional Microstructures by the Anisotropic Etching of (100) and (110) Silicon" by E. Bassous published in the IEEE Transactions on Electron Devices, Vol. ED-25, No. 10, (Oct. 1978), page 1185.

By the use of high quality silicon wafers, one can provide extremely sharp vertical lines in fabrication of the aperture 25. In this manner, the transducer manufacturer can control the mechanical geometry of the device to a much greater degree and control the effective active area of the diaphragm.

Prior to formation of the apertuer 25 or subsequent thereto, one can now selectively etch the layers 22 and 20A to provide a desired gage pattern. The gages thus formed are also single crystal silicon. By the use of a suitable mask, one can then deposit metal terminal areas on the surface of the substrate to provide the desired bridge configuration consisting of the piezoresistive elements as 30 and 31 of FIG. 3E.

It is, of course, understood as indicated above, that conventional resistive arrays can be utilized as, for example, shown in FIG. 2. In any event, the above described method is particularly suitable for forming the gage 11 as depicted in FIG. 1. Essentially, the gage 11 is a transverse voltage gage which responds to shear forces. As can be ascertained from U.S. Pat. No. 3,123,788, the gage is essentially a flat wafer of silicon having a thickness of about 1/11 of the minimum planar dimension. Due to the positioning of the arms of the gage as 11A and 11B, there is formed an X or cross configuration. When a bias is applied, for example, between terminals 34 and 14, one will obtain a current flow via terminals 35 and 36, which current flow is proportional to the magnitude of a force F applied to the surface of the transducer.

The entire operation of the gage 11 as well as the structural considerations are clearly indicated in the above noted patent. However, the gage 11 has further advantages to the transducer manufacturer. The gage allows better dimensional control than bridge configurations. The gage is totally amenable to the etching process and eliminates diffusion and other techniques used for conventional bridge arrays.

As above described, the single crystal layers as 20A and 22 can be simply etched by a selective etching which attacks silicon and not the masked portions of the surface. The gage structure 11 eliminates the need for extremely small line widths as are necessary to produce high quality piezoresistive elements in conventional bridges. Furthermore, since the gage 11 is essentially symmetrical, there is no problem with zero offset and hence, the gage configuration is inherently balanced. This balancing is extremely difficult in prior art bridge configurations.

Thus, there is depicted a method and structure which enables one to provide a single crystal diaphragm having dielectric isolated single crystal sensor devices. The structure is produced by a unique process employing ion implantation of oxygen to produce a buried silicon dioxide layer. Many other modifications and alternative structures will become apparent to those skilled in the art and are deemed to be encompassed within the spirit and scope of the following claims.

What is claimed is:

1. A method of fabricating a semiconductor transducer comprising the steps of:
    ion-implanting high doses of oxygen in a single crystal semiconductor wafer surface to form a buried silicon dioxide layer;
    epitaxially growing an additional layer of silicon on the implanted surface of said wafer to form a composite single crystal layer with said implanted surface included,
    forming a gage pattern on the composite single layer including said implanted surface of said wafer to provide a single crystal gage configuration.

2. The method according to claim 1 wherein the oxide layer is used as an etch stop to form a single crystal diaphragm.

3. The method according to claim 2 wherein piezoresistive elements are formed in said diaphragm layer by diffusion.

4. The method according to claim 1 wherein said step of forming comprises selectively etching the surface of said wafer above said buried layer.

5. The method according to claim 1 further including the step of annealing said ion implanted wafer in an inert atmosphere at a given temperature and time period.

6. The method according to claim 5 wherein said inert atmosphere is nitrogen and said temperature is at 1150° C. for a period of about two hours.

7. The method according to claim 5 wherein said high dose of oxygen is of a concentration greater than $1.8 \times 10^{18}/cm^2$.

* * * * *